(12) United States Patent
Wang et al.

(10) Patent No.: US 11,825,749 B2
(45) Date of Patent: Nov. 21, 2023

(54) PIEZO ACTUATOR FABRICATION METHOD

(71) Applicant: MEMS Drive (Nanjing) Co., Ltd., Nanjing (CN)

(72) Inventors: Guiqin Wang, Arcadia, CA (US);
Xiaolei Liu, South Pasadena, CA (US);
Mahmood Samiee, Glendale, CA (US);
Yufeng Wang, Pasadena, CA (US)

(73) Assignee: MEMS Drive (Nanjing) Co., Ltd., Nanjing (CN)

( * ) Notice: Subject to any disclaimer, the term of this patent is extended or adjusted under 35 U.S.C. 154(b) by 631 days.

(21) Appl. No.: 16/679,219

(22) Filed: Nov. 10, 2019

(65) Prior Publication Data
US 2020/0152856 A1 May 14, 2020

Related U.S. Application Data

(60) Provisional application No. 62/758,229, filed on Nov. 9, 2018.

(51) Int. Cl.
H01L 41/09 (2006.01)
H10N 30/20 (2023.01)
H10N 30/04 (2023.01)
H10N 30/06 (2023.01)
H10N 30/076 (2023.01)
(Continued)

(52) U.S. Cl.
CPC ......... H10N 30/2047 (2023.02); H10N 30/04 (2023.02); H10N 30/06 (2023.02); H10N 30/076 (2023.02); H10N 30/077 (2023.02); H10N 30/082 (2023.02)

(58) Field of Classification Search
CPC ... H01L 41/0973; H01L 41/253; H01L 41/29; H01L 41/316; H01L 41/317; H01L 41/332; H01L 41/22; H01L 41/318; H10N 30/2047; H10N 30/04; H10N 30/06; H10N 30/076; H10N 30/077; H10N 30/082; H10N 30/078; H10N 30/01
See application file for complete search history.

(56) References Cited

U.S. PATENT DOCUMENTS 7,622,846 B2 11/2009 Song et al.
8,450,213 B2 5/2013 De Brabander et al.
(Continued)

FOREIGN PATENT DOCUMENTS

| CN | 108447979 A | 8/2018 | | |
|---|---|---|---|---|
| EP | 0727832 A1 | * 8/1996 | ........... | H01L 41/318 |
| EP | 0886328 A2 | * 12/1998 | ........... | H01L 41/317 |

(Continued)

OTHER PUBLICATIONS

International Search Report and Written Opinion of the International Searching Authority for International PCT Application No. PCT/US2019/060622 dated Jan. 16, 2020.

Primary Examiner — Ermias T Woldegeorgis
(74) Attorney, Agent, or Firm — Brian J. Colandreo; Jeffery T. Placker; Holland & Knight LLP

(57) ABSTRACT

A method of generating a piezoelectric actuator includes: forming a piezoelectric member upon a rigid substrate; and removing one or more portions of the rigid substrate to form one or more gaps in the rigid substrate, thus defining at least one deformable portion of the piezoelectric member and at least one rigid portion of the piezoelectric member.

20 Claims, 8 Drawing Sheets

(51) Int. Cl.
*H10N 30/077* (2023.01)
*H10N 30/082* (2023.01)

(56) References Cited

U.S. PATENT DOCUMENTS

2001/0001458 A1* 5/2001 Hashizume ............ B41J 2/1628
  29/25.35
2012/0262029 A1* 10/2012 De Brabander ...... H01L 41/053
  257/E29.022

FOREIGN PATENT DOCUMENTS

WO       2008082652 A2    7/2008
WO   WO-2012169006 A1 * 12/2012  .......... B23K 10/003

* cited by examiner

PIEZO ACTUATOR FABRICATION METHOD

RELATED CASE(S)

This application claims the benefit of U.S. Provisional Application No. 62/758,229 filed on 9 Nov. 2018; the contents of which are incorporated herein by reference.

TECHNICAL FIELD

This disclosure relates to methods of manufacturing actuators and, more particularly, to methods of manufacturing piezoelectric actuators.

BACKGROUND

As is known in the art, actuators may be used to convert electronic signals into mechanical motion. In many applications such as e.g., portable devices, imaging-related devices, telecommunications components, and medical instruments, it may be beneficial for miniature actuators to fit within the small size, low power, and cost constraints of these applications.

Micro-electrical-mechanical system (MEMS) technology is the technology that in its most general form may be defined as miniaturized mechanical and electro-mechanical elements that are made using the techniques of microfabrication. The critical dimensions of MEMS devices may vary from well below one micron to several millimeters. In general, MEMS actuators are more compact than conventional actuators, and they consume less power.

SUMMARY OF DISCLOSURE

In one implementation, a method of generating a piezoelectric actuator includes: forming a piezoelectric member upon a rigid substrate; and removing one or more portions of the rigid substrate to form one or more gaps in the rigid substrate, thus defining at least one deformable portion of the piezoelectric member and at least one rigid portion of the piezoelectric member.

One or more of the following features may be included. The rigid substrate may be a metallic plate. The piezoelectric member may include: a first electrode layer; a second electrode layer; and a piezoelectric material layer positioned between the first electrode layer and the second electrode layer. Forming a piezoelectric member upon a rigid substrate may include: forming the first electrode layer on the rigid substrate; forming the piezoelectric material layer on the first electrode layer; and forming the second electrode layer on the piezoelectric material layer. Forming the piezoelectric material layer on the first electrode layer may include spinning a piezoelectric material onto the first electrode layer. Forming the piezoelectric material layer on the first electrode layer may include sputtering a piezoelectric material onto the first electrode layer. Forming a piezoelectric member upon a rigid substrate may further includes thermally annealing the piezoelectric material layer. Removing one or more portions of the rigid substrate to form one or more gaps in the rigid substrate may include forming one or more recesses on a first surface of the rigid substrate. Removing one or more portions of the rigid substrate to form one or more gaps in the rigid substrate may further include filling the one or more recesses on the first surface of the rigid substrate with a filler material. Removing one or more portions of the rigid substrate to form one or more gaps in the rigid substrate may further include forming one or more recesses on a second surface of the rigid substrate. The one or more recesses on the second surface of the rigid substrate may be positioned and configured to expose a portion of the filler material within the one or more recesses on the first surface of the rigid substrate. Removing one or more portions of the rigid substrate to form one or more gaps in the rigid substrate may further include removing the filler material within the one or more recesses on the first surface of the rigid substrate to form the one or more gaps in the rigid substrate. A portion of the piezoelectric member may be removed from the rigid substrate.

In another implementation, a method of generating a piezoelectric actuator includes: forming a piezoelectric member upon a rigid substrate, including: forming a first electrode layer on the rigid substrate, forming a piezoelectric material layer on the first electrode layer, forming a second electrode layer on the piezoelectric material layer, and thermally annealing the piezoelectric material layer; and removing one or more portions of the rigid substrate to form one or more gaps in the rigid substrate, thus defining at least one deformable portion of the piezoelectric member and at least one rigid portion of the piezoelectric member.

One or more of the following features may be included. Removing one or more portions of the rigid substrate to form one or more gaps in the rigid substrate may include forming one or more recesses on a first surface of the rigid substrate. Removing one or more portions of the rigid substrate to form one or more gaps in the rigid substrate may further include filling the one or more recesses on the first surface of the rigid substrate with a filler material. Removing one or more portions of the rigid substrate to form one or more gaps in the rigid substrate may further include: forming one or more recesses on a second surface of the rigid substrate, wherein the one or more recesses on the second surface of the rigid substrate are positioned and configured to expose a portion of the filler material within the one or more recesses on the first surface of the rigid substrate. Removing one or more portions of the rigid substrate to form one or more gaps in the rigid substrate may further include removing the filler material within the one or more recesses on the first surface of the rigid substrate to form the one or more gaps in the rigid substrate. A portion of the piezoelectric member may be removed from the rigid substrate.

In another implementation, a method of generating a piezoelectric actuator includes: forming a piezoelectric member upon a rigid substrate; and removing one or more portions of the rigid substrate to form one or more gaps in the rigid substrate, thus defining at least one deformable portion of the piezoelectric member and at least one rigid portion of the piezoelectric member; wherein removing one or more portions of the rigid substrate to form one or more gaps in the rigid substrate includes: forming one or more recesses on a first surface of the rigid substrate, filling the one or more recesses on the first surface of the rigid substrate with a filler material, forming one or more recesses on a second surface of the rigid substrate, and removing the filler material within the one or more recesses on the first surface of the rigid substrate to form the one or more gaps in the rigid substrate.

One or more of the following features may be included. The rigid substrate may be a metallic plate. The piezoelectric member may include: a first electrode layer; a second electrode layer; and a piezoelectric material layer positioned between the first electrode layer and the second electrode layer. Forming a piezoelectric member upon a rigid substrate may include: forming the first electrode layer on the rigid substrate; forming the piezoelectric material layer on the first electrode layer; forming the second electrode layer on the piezoelectric material layer; and thermally annealing the piezoelectric material layer. A portion of the piezoelectric member may be removed from the rigid substrate.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
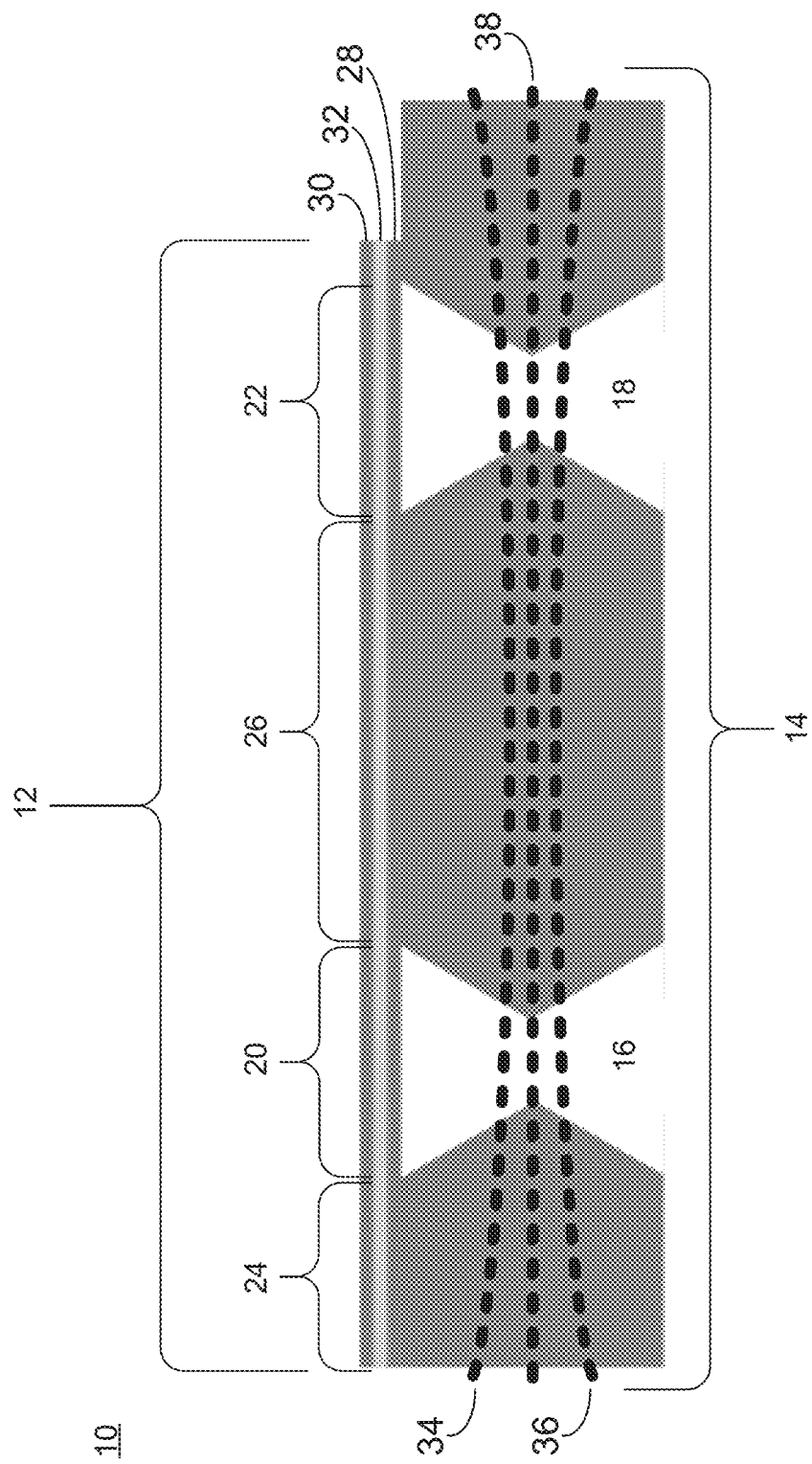
FIG. 1 is a cross-sectional view of a piezoelectric actuator in accordance with various embodiments of the present disclosure.

Actuator Overview:

Referring to FIG. 1, there is shown a cross-sectional view of piezoelectric actuator 10. Piezoelectric actuator 10 may include piezoelectric member 12 positioned upon rigid substrate 14. As will be discussed below in greater detail, rigid substrate 14 may include one or more gaps (e.g., gaps 16, 18), resulting in piezoelectric actuator 10 including one or more deformable portions (e.g., deformable portions 20, 22) and one or more rigid portions (e.g., rigid portions 24, 26).

An example of rigid substrate 14 may include but is not limited to a metallic plate (e.g., a 140-160 micrometer nickel plate). Piezoelectric member 12 may include a first electrode layer (e.g., first electrode layer 28), a second electrode layer (e.g., second electrode layer 30), and a piezoelectric material layer (e.g., piezoelectric material layer 32) positioned between first electrode layer 28 and second electrode layer 30.

Piezoelectric material layer 32 may be formed of a piezoelectric material (e.g., PZT (lead zirconate titanate), zinc oxide or any other suitable material) that may be configured to deflect in response to the application of an electrical signal. As is known in the art, piezoelectric materials are a special type of ceramic that expands or contracts when an electrical charge is applied, thus generating motion and force. Accordingly, piezoelectric actuator 10 may be a bending piezoelectric actuator, wherein piezoelectric member 12 (and, therefore, piezoelectric actuator 10) may be capable of being bent upward (as shown with upward bend indicator 34) and/or being bent downward (as shown with downward bend indicator 36) through the use of gaps (e.g., gaps 16, 18) and deformable portions (e.g., deformable portions 20, 22), Specifically, piezoelectric actuator 10 may be selectively and controllably deformable when an electric charge is applied across e.g., first electrode layer 28 and second electrode layer 30, wherein the polarity of the applied electric charge may vary the direction and/or amount in which piezoelectric actuator 10 is deformed. For example, when no electric charge is applied to piezoelectric actuator 10, piezoelectric actuator 10 may not bend and may be in a relaxed state (as shown with relaxed indicator 38). Additionally and when a first polarity electric charge is applied to piezoelectric actuator 10, piezoelectric actuator 10 may bend upward (as shown with upward bend indicator 34). Further and when a second polarity electric charge is applied to piezoelectric actuator 10, piezoelectric actuator 10 may bend downward (as shown with downward bend indicator 36).

Fabrication Methodology:

The following discussion concerns the manner in which piezoelectric actuator 10 may be fabricated.

Figure 2:
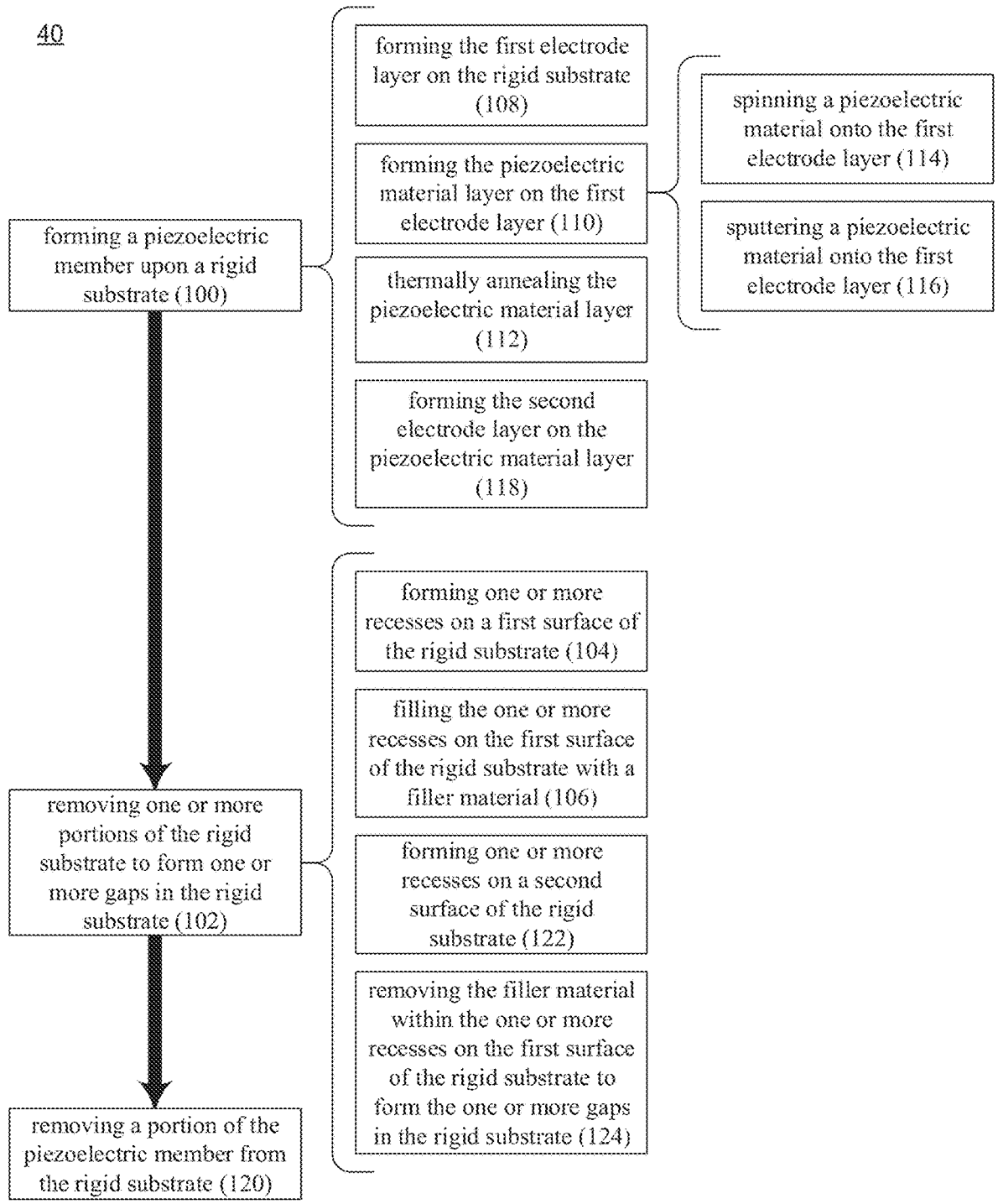
FIG. 2 is a flow chart of a method of producing the piezoelectric actuator of FIG. 1 in accordance with various embodiments of the present disclosure.

Referring also to FIG. 2 and in order to fabricate piezoelectric actuator 10, piezoelectric actuator fabrication process 40 may form 100 a piezoelectric member (e.g., piezoelectric member 12) upon a rigid substrate (e.g., rigid substrate 14) and may remove 102 one or more portions of rigid substrate 14 to form one or more gaps (e.g., gaps 16, 18) in rigid substrate 14, thus defining at least one deformable portion (e.g., deformable portions 20, 22) of piezoelectric member 12 and at least one rigid portion (e.g., rigid portions 24, 26) of piezoelectric member 12.

Figure 3:
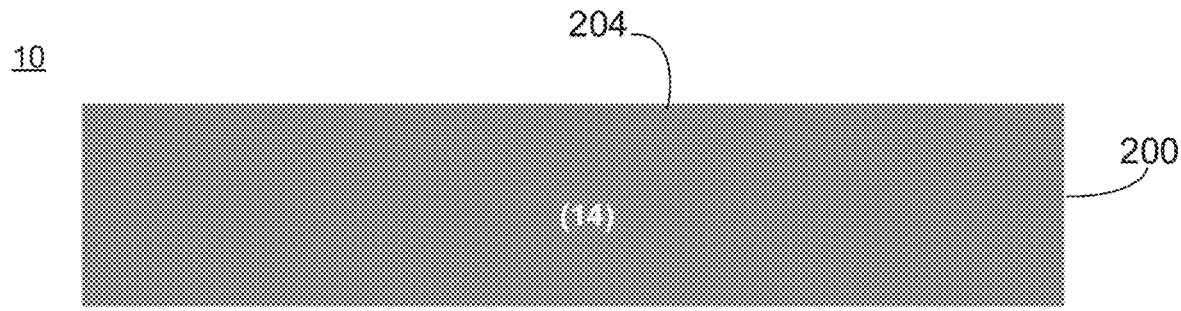
FIGS. 3-18 are cross-sectional views of the piezoelectric actuator of FIG. 1 in accordance with various embodiments of the present disclosure.
Figure 4:
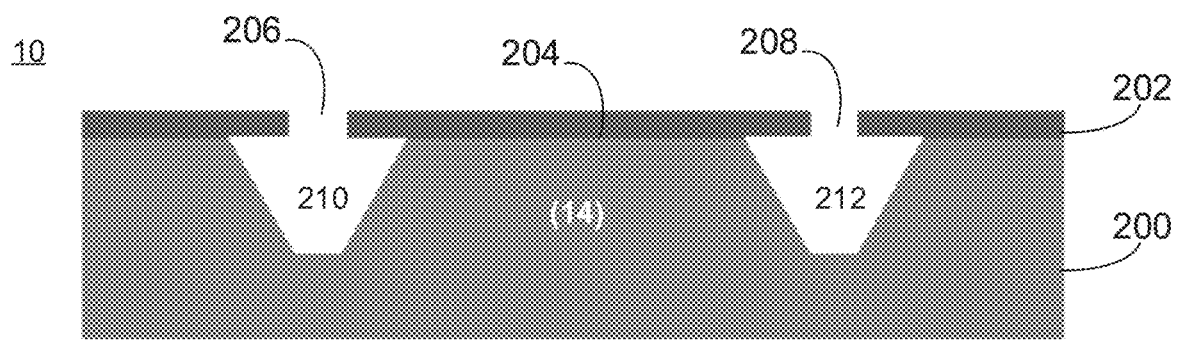
Figure 5:
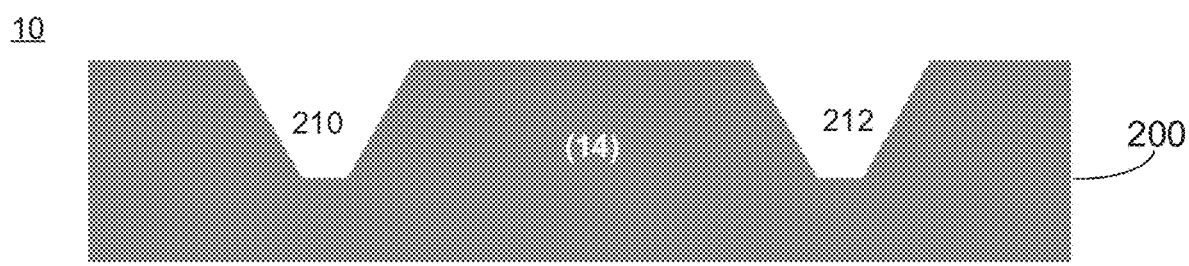

When removing 102 one or more portions of rigid substrate 14 to form one or more gaps (e.g., gaps 16, 18) in rigid substrate 14, piezoelectric actuator fabrication process 40 may form 104 one or more recesses on a first surface of rigid substrate 14. For example, piezoelectric actuator fabrication process 40 may start with metallic plate 200, as shown in FIG. 3. An example of metallic plate 200 may include but is not limited to a 140-160 micrometer nickel plate. A resist mask (e.g., resist mask 202), as shown in FIG. 4, may be applied to a first surface (e.g., first surface 204) of plate 200, wherein resist mask 202 may include passages (e.g., passages 206, 208) for defining the location of the one or more recesses (e.g., recesses 210, 212) on first surface 204 of rigid substrate 14. A chemical etch process (e.g., using Nickel Etchant TFG (Transene) if metallic plate 200 is nickel) may be utilized to generate recesses 210, 212. Recesses 210, 212 may have a depth of approximately 80 micrometers and may have a minimum separation of approximately 300 micrometers. Once this chemical etching process is completed, resist mask 202 may be stripped from metallic plate 200, as shown in FIG. 5.

Figure 6:
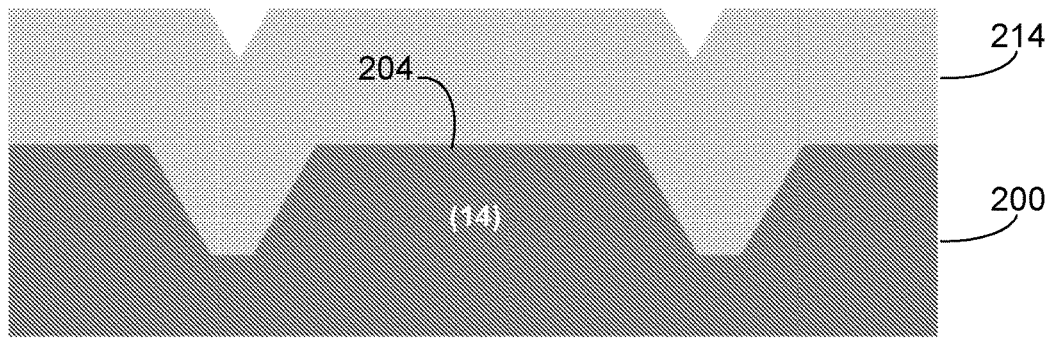

Additionally and when removing 102 one or more portions of rigid substrate 14 to form one or more gaps (e.g., gaps 16, 18) in rigid substrate 14, piezoelectric actuator fabrication process 40 may fill 106 the one or more recesses (e.g., recesses 210, 212) on the first surface (e.g., first surface 204) of rigid substrate 14 with a filler material (e.g., filler material 214), as shown in FIG. 6. An example of filler material 214 may include but is not limited to copper, which may be applied via an electroplating process. The thickness of filler material 214 may be sufficient to fill the one or more recesses (e.g., recesses 210, 212). As discussed above, recesses 210, 212 may have a depth of 80 micrometers. Accordingly, the thickness of filler material 214 may be greater than 90 micrometers.

Figure 7:
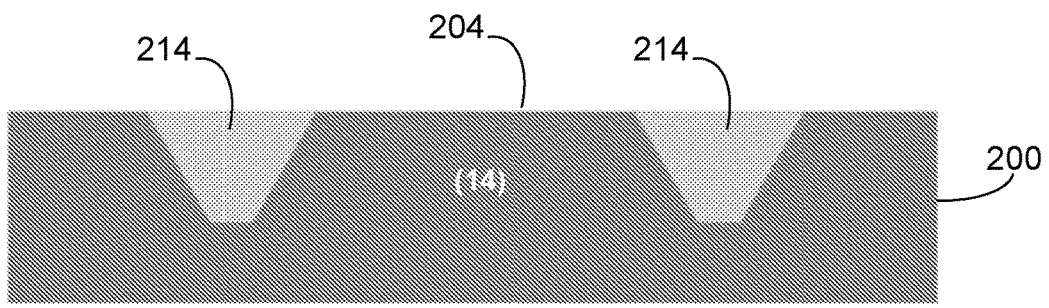

Metallic plate 200 may then be polished to remove filler mater 214 from first surface 204 of metallic plate 200 so that filler material 214 only remains in the one or more recesses (e.g., recesses 210, 212), as shown in FIG. 7. Once this polishing process is complete, piezoelectric actuator fabrication process 40 may begin the process of forming 100 piezoelectric member 12 upon rigid substrate 14.

Figure 8:
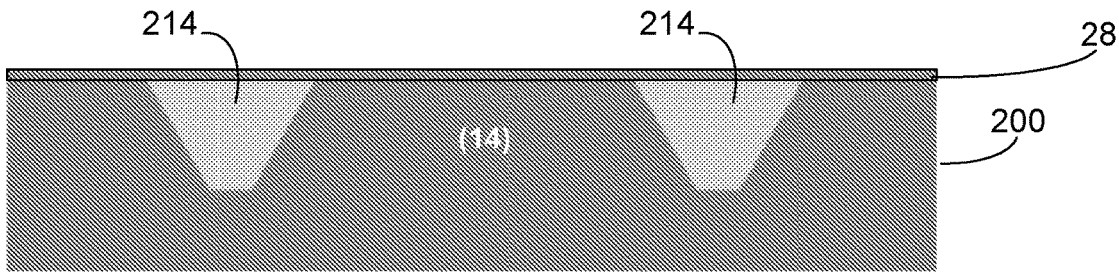

Forming 100 a piezoelectric member (e.g., piezoelectric member 12) upon a rigid substrate (e.g., rigid substrate 14) may include forming 108 the first electrode layer (e.g., first electrode layer 28) on rigid substrate 14 (as shown in FIG. 8), which may encapsulate filler material 214. An example of first electrode layer 28 may include but is not limited to a layer of nickel (typically having a thickness in the range of 2-20 micrometers, which may be determined by various design criteria and optimized for different purposes) that may be applied via an electroplating process.

Figure 9:
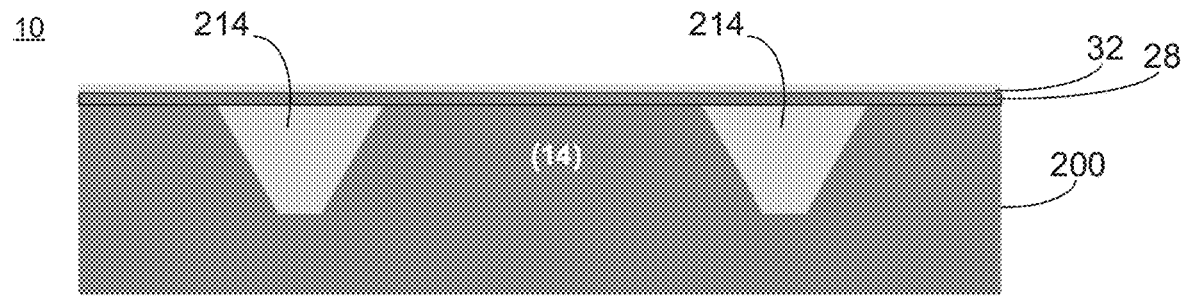

Forming 100 a piezoelectric member (e.g., piezoelectric member 12) upon a rigid substrate (e.g., rigid substrate 14) may further include forming 110 the piezoelectric material layer (e.g., piezoelectric material layer 32) on the first electrode layer (e.g., first electrode layer 28), as shown in FIG. 9. A typical thickness of piezoelectric material layer 32 may be in the range of 0.1~2.0 micrometers. As discussed above, piezoelectric material layer 32 may be formed of a piezoelectric material (e.g., PZT (lead zirconate titanate), zinc oxide or any other suitable material) that may be configured to deflect in response to the application of an electrical signal.

Forming 100 a piezoelectric member (e.g., piezoelectric member 12) upon a rigid substrate (e.g., rigid substrate 14) may further include thermally annealing 112 the piezoelectric material layer (e.g., piezoelectric material layer 32). In metallurgy and materials science, annealing is a heat treatment process that alters the physical and sometimes chemical properties of a material to increase its ductility and reduce its hardness, making it more workable. Annealing involves heating a material above its recrystallization temperature (e.g., above 700 degrees Celsius in this example), maintaining a suitable temperature for a suitable amount of time, and then cooling. In annealing, atoms migrate in the crystal lattice and the number of dislocations decreases, leading to a change in ductility and hardness. As the material cools, it recrystallizes. For many materials, the crystal grain size and phase composition, which ultimately determine the material properties, are dependent upon the heating rate and cooling rate. Accordingly and with knowledge of the composition and phase diagram of a material, annealing may be used to adjust a material from harder and more brittle to softer and more ductile.

When forming 110 the piezoelectric material layer (e.g., piezoelectric material layer 32) on the first electrode layer (e.g., first electrode layer 28), piezoelectric actuator fabrication process 40 may spin 114 a piezoelectric material (e.g., PZT (lead zirconate titanate), zinc oxide or any other suitable material) onto the first electrode layer (e.g., first electrode layer 28). When spinning 114 material onto a surface (e.g., first electrode layer 28), each spun application of the material may be comparatively thin (e.g., 0.10 micrometers). Accordingly and if piezoelectric material layer 32 is to have a thickness of 1 micrometers (as discussed above), many layers of piezoelectric material may need to be spun onto first electrode layer 28. In such a situation, the above-described annealing process may need to be repeated many times (e.g., once for each layer of spun piezoelectric material.

Alternatively and when forming 110 the piezoelectric material layer (e.g., piezoelectric material layer 32) on the first electrode layer (e.g., first electrode layer 28), piezoelectric actuator fabrication process 40 may sputter 116 a piezoelectric material (e.g., PZT (lead zirconate titanate), zinc oxide or any other suitable material) onto the first electrode layer (e.g., first electrode layer 28). When sputtering 116 material onto a surface (e.g., first electrode layer 28), each sputtered application of the material may be somewhat thin (e.g., 0.50 micrometers). Accordingly and if piezoelectric material layer 32 is to have a thickness of 1 micrometers (as discussed above), several layers of piezoelectric material may need to be sputtered onto first electrode layer 28. In such a situation, the above-described annealing process may need to be repeated several times (e.g., once for each layer of sputtered piezoelectric material.

Figure 10:
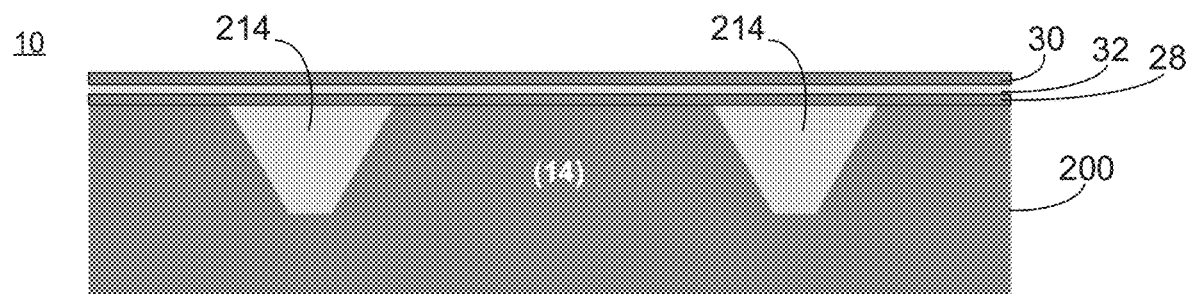

Forming 100 a piezoelectric member (e.g., piezoelectric member 12) upon a rigid substrate (e.g., rigid substrate 14) may further include forming 118 the second electrode layer (e.g., second electrode layer 30) on the piezoelectric material layer (e.g., piezoelectric material layer 32), as shown in FIG. 10. An example of second electrode layer 30 may include but is not limited to a layer of nickel (having a typical thickness in the range of 0.02~0.50 micrometers) that may be applied via an electroless plating process.

Figure 11:
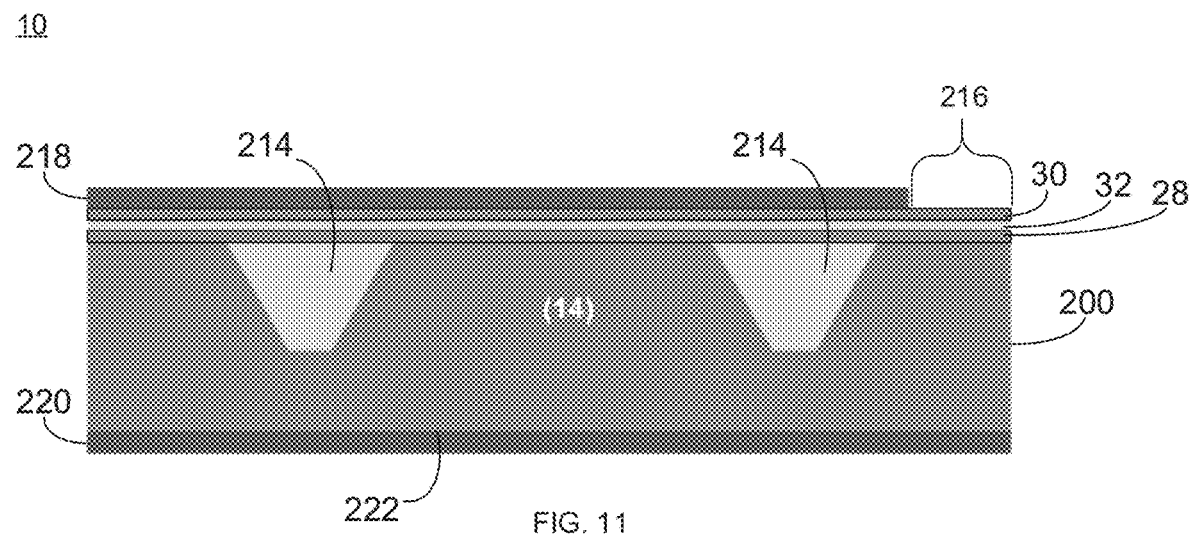
Figure 12:
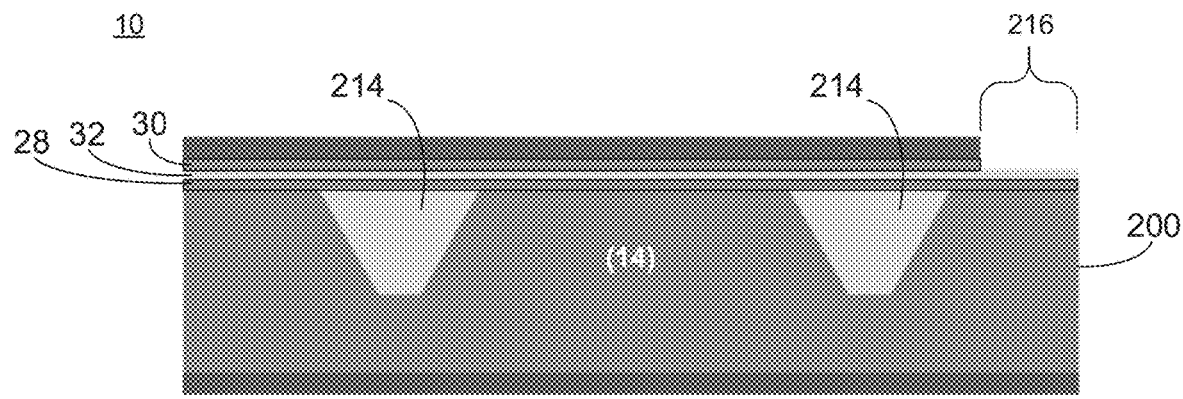
Figure 13:
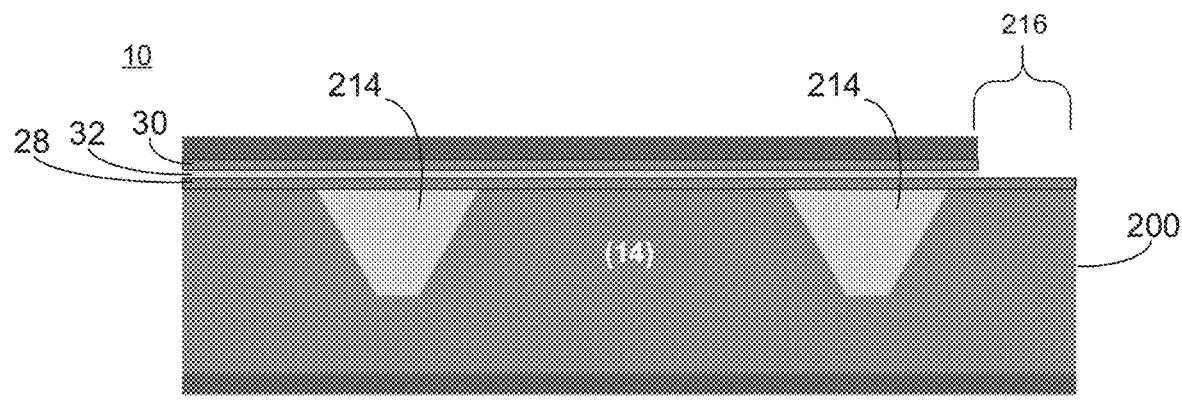
Figure 14:
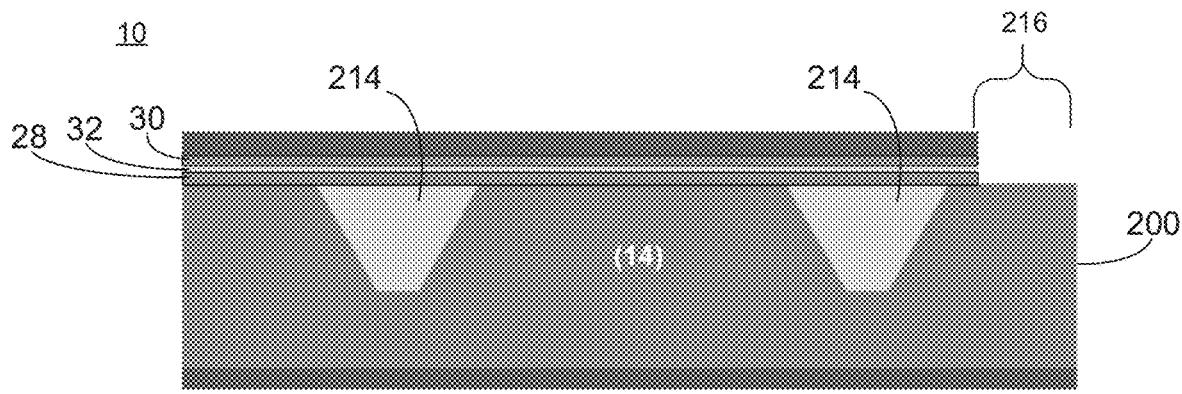

Depending upon the particular application and design criteria, piezoelectric actuator fabrication process 40 may remove 120 a portion of piezoelectric member 12 from rigid substrate 114. For example and as shown in FIG. 11, assume that due to the desired level of deformability of piezoelectric actuator 10, it is desirable to remove portion 216 of piezoelectric member 12 from rigid substrate 114. A patterned first resist mask (e.g., resist mask 218) may be applied to second electrode layer 30, wherein resist mask 218 exposes portion 216 of piezoelectric member 12. The patterned first resist mask (e.g., resist mask 218) may be patterned before or after being applied to second electrode layer 30. Further, a second resist mask (e.g., resist mask 220) may be applied to a second surface (e.g., second surface 222) of plate 200. A chemical etch process may be utilized to remove 120 portion 216 of piezoelectric member 12 from rigid substrate 114. For example, a wet chemical etch process (e.g., using Nickel Etchant TFG (Transene) if second electrode layer 30 is nickel) may be used to remove the second electrode layer portion of portion 216 of piezoelectric member 12 (as shown in FIG. 12). Further, a multipart etch process (e.g., using BOE and HCL if PZT is selected as the piezoelectric material) may be used to remove the piezoelectric material layer portion of portion 216 of piezoelectric member 12 (as shown in FIG. 13). Additionally, a wet chemical etch process (e.g., using Nickel Etchant TFG (Transene) if first electrode layer 28 is nickel) may be used to remove the first electrode layer portion of portion 216 of piezoelectric member 12 (as shown in FIG. 14).

Once piezoelectric member 12 is formed 100 upon rigid substrate 14. piezoelectric actuator fabrication process 40 may continue the process of removing 102 one or more portions of rigid substrate 14 to form one or more gaps (e.g., gaps 16, 18) in rigid substrate 14. Specifically, removing 102 one or more portions of rigid substrate 14 to form one or more gaps (e.g., gaps 16, 18) in rigid substrate 14 may include forming 122 one or more recesses on second surface 222 of rigid substrate 14.

Figure 15:
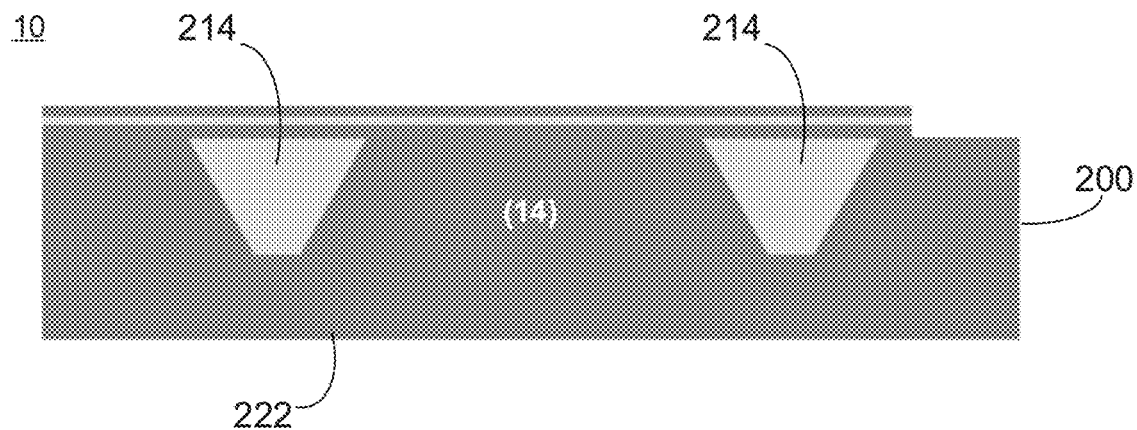
Figure 16:
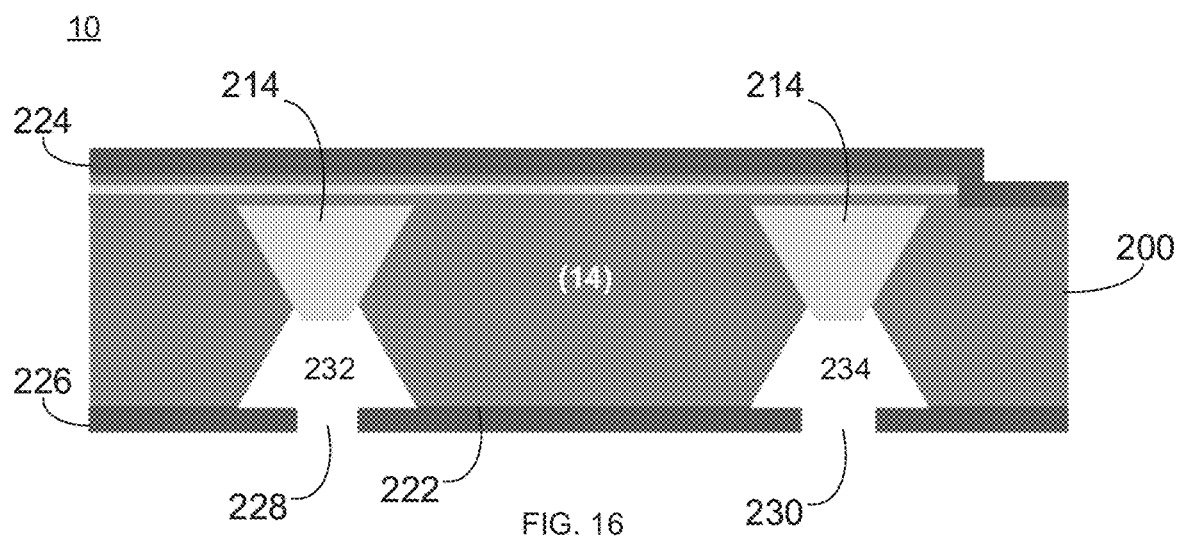

For example, resist masks 218, 220 (See FIG. 11) may be striped (as shown in FIG. 15) and updated resist masks 224, 226 may be applied, as shown in FIG. 16. For example, updated resist masks 224 may be applied to protect piezoelectric member 12. Further, updated resist masks 226 may be applied to second surface 222 of plate 200, wherein updated resist mask 226 may be patterned to include passages (e.g., passages 228, 230) for defining the location of the one or more recesses (e.g., recesses 232, 234, respectively) on second surface 222 of rigid substrate 14. A chemical etch process (e.g., using Nickel Etchant TFG (Transene) if metallic plate 200 is nickel) may be utilized to generate recesses 232, 234. Recesses 210, 212 may have a depth of approximately 60 micrometers and may have a minimum separation of approximately 300 micrometers.

The one or more recesses (e.g., recesses 232, 234, respectively) on second surface 222 of rigid substrate 14 may be positioned and configured to expose a portion of filler material 214 within the one or more recesses (e.g., recesses 210, 212) on first surface 204 of rigid substrate 14.

Figure 17:
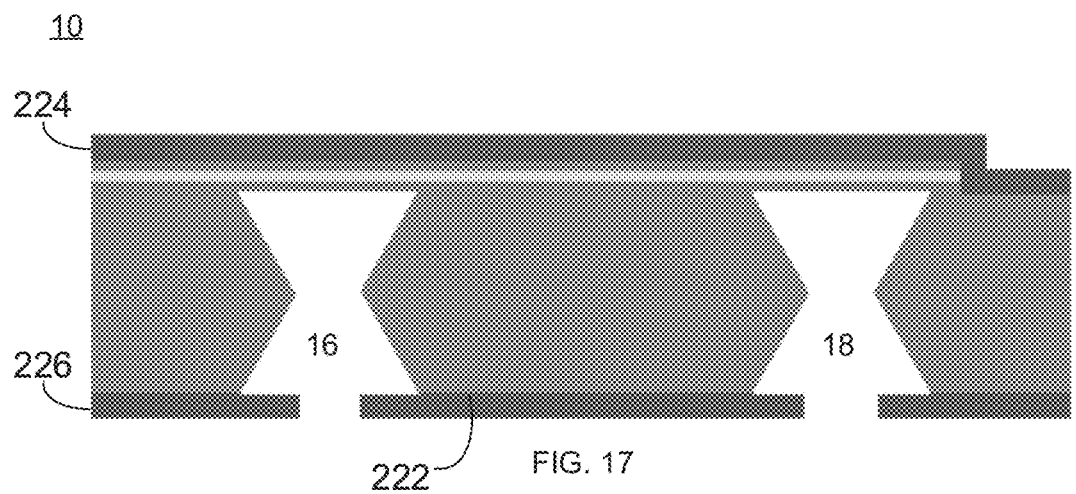

When removing 102 one or more portions of rigid substrate 14 to form one or more gaps (e.g., gaps 16, 18) in rigid substrate 14, piezoelectric actuator fabrication process 40 may remove 124 filler material 214 within the one or more recesses (e.g., recesses 210, 212) on first surface 204 of rigid substrate 114 to form the one or more gaps (e.g., gaps 16, 18) in rigid substrate 114. A chemical etch process may be utilized to remove 124 filler material 214 within the one or more recesses (e.g., recesses 210, 212) on first surface 204 of rigid substrate 114. For example, a wet chemical etch process (e.g., using $H_2O_2$+Acetic Acid solution if filler material 214 is copper) may be used to selectively remove filler material 214 (as shown in FIG. 17).

Figure 18:
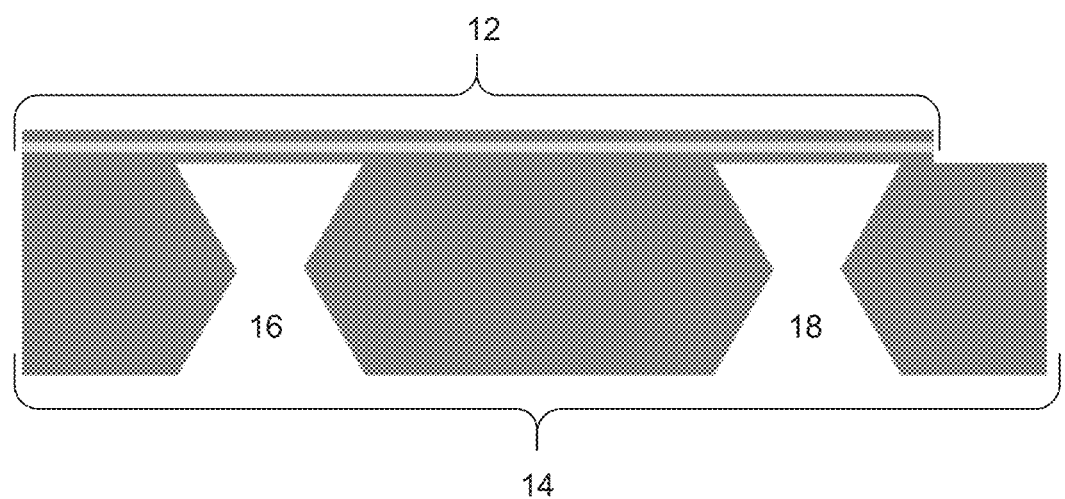

Once this chemical etching process is completed, updated resist masks 224, 226 may be stripped from piezoelectric actuator 10, as shown in FIG. 18. Further, piezoelectric actuator 10 may be polled at an elevated temperature (e.g., approximately 150 degrees Celsius) to further condition piezoelectric material layer 32.

General:

In general, the various operations of the method described herein may be accomplished using or may pertain to components or features of the various systems and/or apparatus with their respective components and subcomponents, described herein.

The presence of broadening words and phrases such as "one or more," "at least," "but not limited to" or other like phrases in some instances shall not be read to mean that the narrower case is intended or required in instances where such broadening phrases may be absent.

Additionally, the various embodiments set forth herein are described in terms of example block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

While various embodiments of the present disclosure have been described above, it should be understood that they have been presented by way of example only, and not of limitation. Likewise, the various diagrams may depict an example architectural or other configuration for the disclosure, which is done to aid in understanding the features and functionality that can be included in the disclosure. The disclosure is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present disclosure. Additionally, with regard to flow diagrams, operational descriptions and method claims, the order in which the steps are presented herein shall not mandate that various embodiments be implemented to perform the recited functionality in the same order unless the context dictates otherwise.

Although the disclosure is described above in terms of various example embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosure, whether or not such embodiments are described and whether or not such features are presented as being a part of a described embodiment. Thus, the breadth and scope of the present disclosure should not be limited by any of the above-described example embodiments, and it will be understood by those skilled in the art that various changes and modifications to the previous descriptions may be made within the scope of the claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A method of generating a piezoelectric actuator comprising:
   forming a piezoelectric member upon a rigid substrate, wherein the piezoelectric member includes a first electrode layer on a first surface of the rigid substrate, a second electrode layer, and a piezoelectric material layer, forming the piezoelectric member including:
      forming one or more recesses on the first surface of the rigid substrate;
      filling the one or more recesses on the first surface of the rigid substrate with a filler material;
      polishing the first surface of the rigid substrate to remove any filler material from the first surface of the rigid substrate; and
      forming the first electrode layer on the first surface of the rigid substrate at least partially encapsulating the filler material within the one or more recesses;
   removing one or more portions of the rigid substrate to form one or more gaps in the rigid substrate, thus defining at least one deformable portion of the piezoelectric member and at least one rigid portion of the piezoelectric member, wherein removing includes applying a first mask to the second electrode layer on the first surface of the rigid substrate and applying a second mask to a second surface of the rigid substrate; and polling the piezoelectric actuator at an elevated temperature of approximately 150 degrees Celsius to condition the piezoelectric material layer.

2. The method of claim 1 wherein the piezoelectric material layer positioned between the first electrode layer and the second electrode layer.

3. The method of claim 2 wherein forming the piezoelectric member upon the rigid substrate includes:
forming the first electrode layer on the rigid substrate;
forming the piezoelectric material layer on the first electrode layer; and
forming the second electrode layer on the piezoelectric material layer.

4. The method of claim 3 wherein forming the piezoelectric material layer on the first electrode layer includes:
spinning a piezoelectric material onto the first electrode layer.

5. The method of claim 3 wherein forming the piezoelectric material layer on the first electrode layer includes:
sputtering a piezoelectric material onto the first electrode layer.

6. The method of claim 2 wherein forming the piezoelectric member upon the rigid substrate further includes:
thermally annealing the piezoelectric material layer.

7. The method of claim 1 wherein removing one or more portions of the rigid substrate to form one or more gaps in the rigid substrate further includes:
forming one or more recesses on the second surface of the rigid substrate.

8. The method of claim 7 wherein the one or more recesses on the second surface of the rigid substrate are positioned and configured to expose a portion of the filler material within the one or more recesses on the first surface of the rigid substrate.

9. The method of claim 7 wherein removing one or more portions of the rigid substrate to form one or more gaps in the rigid substrate further includes:
removing the filler material within the one or more recesses on the first surface of the rigid substrate to form the one or more gaps in the rigid substrate.

10. The method of claim 1 wherein the rigid substrate is a metallic plate.

11. The method of claim 1 further comprising:
removing a portion of the piezoelectric member from the rigid substrate.

12. A method of generating a piezoelectric actuator comprising:
forming a piezoelectric member upon a rigid substrate, including:
forming one or more recesses on a first surface of the rigid substrate;
filling the one or more recesses on the first surface of the rigid substrate;
polishing the first surface of the rigid substrate to remove any filler material from the first surface of the rigid substrate;
forming a first electrode layer on the first surface of the rigid substrate at least partially encapsulating the filler material within the one or more recesses,
forming a piezoelectric material layer on the first electrode layer,
forming a second electrode layer on the piezoelectric material layer, and
thermally annealing the piezoelectric material layer;

removing one or more portions of the rigid substrate to form one or more gaps in the rigid substrate, thus defining at least one deformable portion of the piezoelectric member and at least one rigid portion of the piezoelectric member, wherein removing includes applying a first mask to the second electrode layer on the first surface of the rigid substrate and applying a second mask to a second surface of the rigid substrate; and polling the piezoelectric actuator at an elevated temperature of approximately 150 degrees Celsius to condition the piezoelectric material layer.

13. The method of claim 12 wherein removing one or more portions of the rigid substrate to form one or more gaps in the rigid substrate further includes:
forming one or more recesses on the second surface of the rigid substrate, wherein the one or more recesses on the second surface of the rigid substrate are positioned and configured to expose a portion of the filler material within the one or more recesses on the first surface of the rigid substrate.

14. The method of claim 13 wherein removing one or more portions of the rigid substrate to form one or more gaps in the rigid substrate further includes:
removing the filler material within the one or more recesses on the first surface of the rigid substrate to form the one or more gaps in the rigid substrate.

15. The method of claim 12 further comprising:
removing a portion of the piezoelectric member from the rigid substrate.

16. A method of generating a piezoelectric actuator comprising:
forming a piezoelectric member upon a rigid substrate, wherein the piezoelectric member includes a first electrode layer on a first surface of the rigid substrate, a second electrode layer, and a piezoelectric material layer, forming the piezoelectric member including:
forming one or more recesses on the first surface of the rigid substrate;
filling the one or more recesses on the first surface of the rigid substrate with a filler material;
polishing the first surface of the rigid substrate to remove any filler material from the first surface of the rigid substrate; and
forming the first electrode layer on the first surface of the rigid substrate at least partially encapsulating the filler material within the one or more recesses; and
removing one or more portions of the rigid substrate to form one or more gaps in the rigid substrate, thus defining at least one deformable portion of the piezoelectric member and at least one rigid portion of the piezoelectric member;
wherein removing one or more portions of the rigid substrate to form one or more gaps in the rigid substrate includes:
applying a first mask to the second electrode layer on the first surface of the rigid substrate;
applying a second mask to a second surface of the rigid substrate;
forming one or more recesses on the second surface of the rigid substrate,
filling the one or more recesses on the second surface of the rigid substrate with a filler material,
removing the filler material within the one or more recesses on the first surface and the second surface of the rigid substrate to form the one or more gaps in the rigid substrate, and polling the piezoelectric actuator at an elevated temperature of approximately 150 degrees Celsius to condition the piezoelectric material layer.

17. The method of claim 16 wherein the rigid substrate is a metallic plate.

18. The method of claim 16 wherein the piezoelectric material layer positioned between the first electrode layer and the second electrode layer.

19. The method of claim 16 wherein forming a piezoelectric member upon a rigid substrate includes:
   forming the first electrode layer on the rigid substrate;
   forming the piezoelectric material layer on the first electrode layer;
   forming the second electrode layer on the piezoelectric material layer; and
   thermally annealing the piezoelectric material layer.

20. The method of claim 16 further comprising:
   removing a portion of the piezoelectric member from the rigid substrate.

* * * * *